(12) United States Patent
Kondou

(10) Patent No.: US 8,217,725 B2
(45) Date of Patent: Jul. 10, 2012

(54) ELECTRICAL CIRCUIT AND RING OSCILLATOR CIRCUIT INCLUDING EVEN-NUMBER INVERTERS

(75) Inventor: Masafumi Kondou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/942,669

(22) Filed: Nov. 9, 2010

(65) Prior Publication Data
US 2011/0053548 A1 Mar. 3, 2011

Related U.S. Application Data

(63) Continuation of application No. PCT/JP2008/060050, filed on May 30, 2008.

(51) Int. Cl.
*H03K 3/03* (2006.01)
*H03B 27/00* (2006.01)
(52) U.S. Cl. ............................. 331/57; 331/45
(58) Field of Classification Search .................. 331/45, 331/57
See application file for complete search history.

(56) References Cited

U.S. PATENT DOCUMENTS

| | | | | |
|---|---|---|---|---|
| 4,617,529 A | * | 10/1986 | Suzuki | 331/57 |
| 5,565,817 A | * | 10/1996 | Lakshmikumar | 331/57 |
| 5,592,126 A | | 1/1997 | Boudewijns et al. | |
| 5,614,871 A | | 3/1997 | Miyabe | |
| 6,781,431 B2 | * | 8/2004 | Taito et al. | 327/291 |
| 7,501,874 B2 | | 3/2009 | Horibata et al. | |
| 2004/0032300 A1 | | 2/2004 | Joordens et al. | |
| 2005/0225400 A1 | | 10/2005 | Yoneya | |
| 2006/0066413 A1 | | 3/2006 | Takahashi | |
| 2007/0241826 A1 | * | 10/2007 | Ueno | 331/57 |
| 2008/0069292 A1 | * | 3/2008 | Straayer et al. | 377/46 |

FOREIGN PATENT DOCUMENTS

| | | |
|---|---|---|
| JP | 06-188634 A | 7/1994 |
| JP | 08-265108 A | 10/1996 |
| JP | 2004-088496 A | 3/2004 |
| JP | 2004-096362 A | 3/2004 |
| JP | 2005-536923 A | 12/2005 |
| JP | 2007-189614 A | 7/2007 |
| WO | WO 2004/017518 A2 | 2/2004 |

OTHER PUBLICATIONS

A.Maxim et al., "0.13µ CMOS Hybrid TV Tuner Using a Calibrated Image and Harmonic Rejection Mixer", Symposium on VLSI Circuits Digest of Technical Papers, 2007, pp. 206-207.

* cited by examiner

*Primary Examiner* — Levi Gannon
(74) *Attorney, Agent, or Firm* — Arent Fox LLP

(57) ABSTRACT

An electrical circuit includes a first path including even-number inverters connected in series from a first node serving as an input side to a second node serving as an output side, a second path including even-number inverters connected in series from the second node serving as an input side to the first node serving as an output side, a latch circuit providing a connection between the first node and the second node such that a logical value of the first node and a logical value of the second node are opposite to each other, and one or more control signal paths to supply one or more control signals to the latch circuit to provide and sever a connection between the latch circuit and a power supply.

11 Claims, 15 Drawing Sheets

ELECTRICAL CIRCUIT AND RING OSCILLATOR CIRCUIT INCLUDING EVEN-NUMBER INVERTERS

CROSS-REFERENCE TO RELATED APPLICATIONS

This is a continuation of International Application No. PCT/JP2008/060050, filed on May 30, 2008, the entire contents of which are hereby incorporated by reference.

FIELD

The disclosures herein generally relate to electrical circuits, and particularly relate to a ring oscillator circuit that generates even-number-phase clock signals.

BACKGROUND

In receivers of radio communication systems utilizing quadrature modulation, four-phase clock signals having 0 degrees, 90 degrees, 180 degrees, and 270 degrees are generated and supplied to a mixer circuit in order to perform quadrature modulation with respect to an in-phase component and a quadrature-phase component. For the purpose of generating even-number clock signals such as four-phase clock signals, generally, an oscillating frequency that is even-number times (i.e., four times in the case of four phases) as high as a desired frequency is generated and divided to produce clock signals having the desired frequency. In the case of four phases, four consecutive cycles of the oscillating signal having the base frequency corresponds to the 0-degree phase, 90-degree phase, 180-degree phase, and 270-degree phase of a frequency-divided signal having ¼ the frequency. These four-phase clock signals can thus be easily generated.

The above-described scheme that generates an oscillating signal having even-number times a desired frequency gives rise to a problem in that electrical current consumption increases due to the use of high-frequency signals. Further, the generation of accurate high-frequency signals may involve using LCVCO (LC-oscillator-based voltage controlled oscillator), which uses an LC oscillator having an inductor and a capacitor. An LCVCO may be produced by use of a special manufacturing process and large circuit size. This gives rise to a problem in that the use of such a LCVCO results in a cost increase compared to the use of a VCO (.e., ring VCO) utilizing a ring oscillator circuit.

A ring VCO that is favorable from a cost point of view is generally comprised of odd-number inverters in order to induce oscillation. Even-number phases are produced by using a ring oscillator circuit comprised of even-number inverters. Such a ring oscillator circuit having even-number stages, however, does not oscillate on its own. In consideration of this, provision may be made such that two nodes having a 180-degree phase difference with each other are connected to the respective ends of a latch. With this provision, these two nodes are forced to change to the opposite phases at the same time.

[Patent Document 1] Japanese Laid-open Patent Publication No. 8-265108

[Patent Document 2] Japanese Laid-open Patent Publication No. 2007-189614

[Non-Patent Document 1] A. Maxim, R. Johns, S. Dupue, "0.13µ CMOS Hybrid TV Tuner Using a Calibrated Image and Harmonic Rejection Mixer," 2007 Symposium on VLSI Circuits Digest of Technical Papers, pp. 206-207

SUMMARY

According to an aspect of the embodiment, an electrical circuit includes a first path including even-number inverters connected in series from a first node serving as an input side to a second node serving as an output side, a second path including even-number inverters connected in series from the second node serving as an input side to the first node serving as an output side, a latch circuit providing a connection between the first node and the second node such that a logical value of the first node and a logical value of the second node are opposite to each other, and one or more control signal paths to supply one or more control signals to the latch circuit to provide and sever a connection between the latch circuit and a power supply.

According to an aspect of the embodiment, a ring oscillator circuit includes a ring including even-number inverters, a first latch circuit providing a connection between a first node and a second node on the ring, and one or more control signal paths to supply one or more control signals to the latch circuit to provide and sever a connection between the latch circuit and a power supply.

According to an aspect of the embodiment, a receiver circuit includes a ring oscillator circuit including: a ring including even-number inverters; a first latch circuit providing a connection between a first node and a second node on the ring; and a second latch circuit providing a connection between a third node and a fourth node on the ring, wherein the ring oscillator circuit generates four-phase clock signals having a π/2 phase difference with each other at the first through fourth nodes while one or more control signals responsive to a signal propagating on the ring are used to provide and sever a connection between a power supply and the first and second latch circuits, and a mixer circuit configured to downconvert a received signal in response to the four-phase clock signals.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
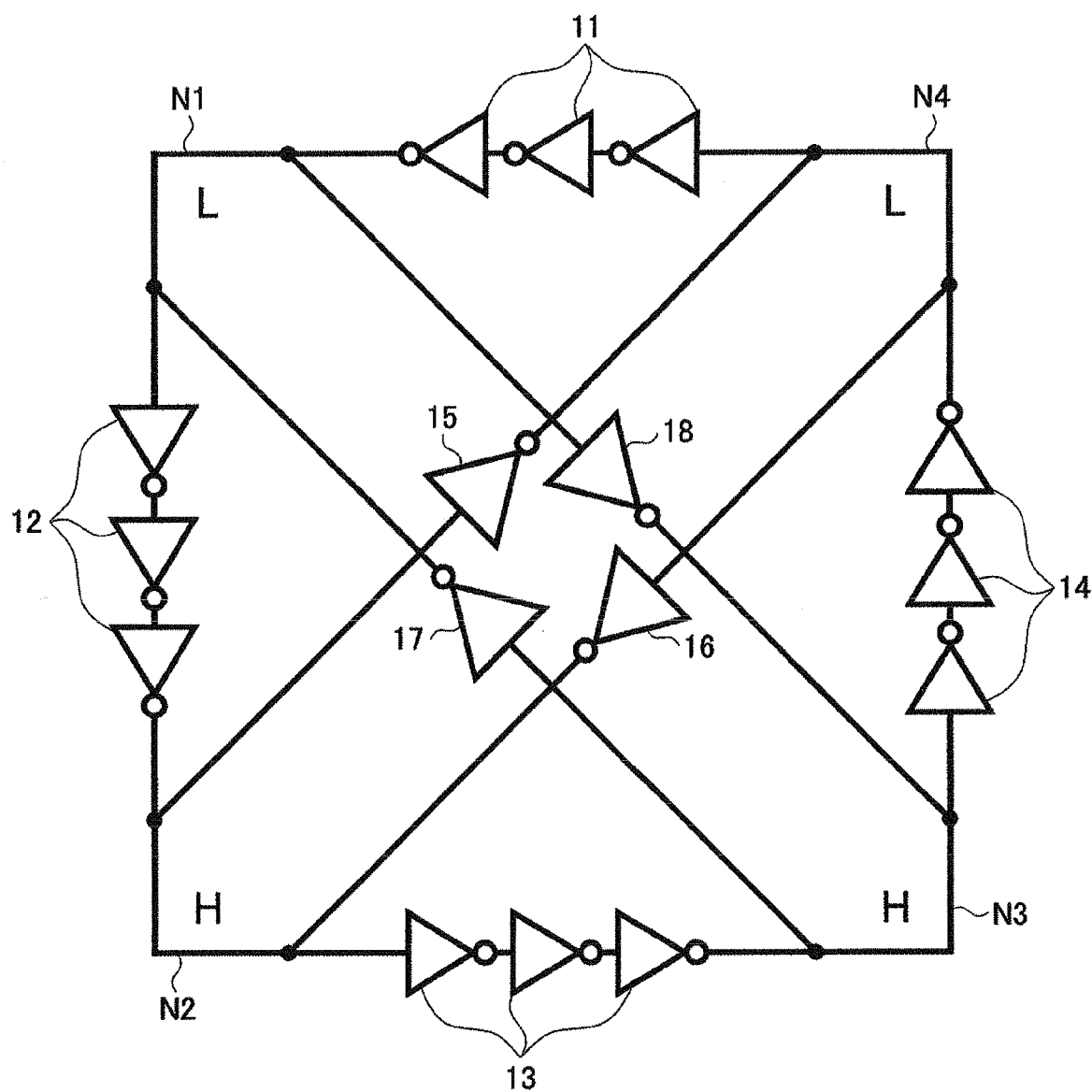
FIG. 1 is a drawing illustrating an example of the configuration of an even-number-stage ring oscillator circuit.

FIG. 1 is a drawing illustrating an example of the configuration of an even-number-stage ring oscillator circuit. The ring oscillator circuit illustrated in FIG. 1 includes a plurality of inverters 11, a plurality of inverters 12, a plurality of inverters 13, a plurality of inverters 14, and inverters 15 through 18. Although FIG. 1 illustrates an example in which the number of inverters 11 is three, the number of inverters 11 may be any number. The same applies in the case of the inverters 12, the inverters 13, and the inverters 14. In general, even-number inverters are situated between a node N1 and a node N3, and even-number inverters are situated between a node N2 and a node N4.

In respect of the inverters 11 through 14, the output of any given stage is connected to the input of the next following stage to constitute a loop. In FIG. 1, the last output node of the inverters 11 is denoted as the node N1, the last output node of the inverters 12 denoted as the node N2, the last output node of the inverters 13 denoted as the node N3, and the last output node of the inverters 14 denoted as the node N4. The loop (ring) connection of these inverters creates a stable state in which the signal levels of the nodes N1, N2, N3, and N4 are HIGH, LOW, HIGH, and LOW, respectively, fore example. It follows that the mere provision of the inverter loop (ring) does not induce oscillation.

In the configuration illustrated in FIG. 1, the two nodes N1 and N3 that are supposed to have a 180-degree phase difference with each other are connected through the inverters 17 and 18. Specifically, the node N1 is connected to the output of the inverter 17 and to the input of the inverter 18, and the node N3 is connected to the input of the inverter 17 and to the output of the inverter 18. In this manner, either one of the inverters 17 and 18 provides its output to the input of the other, thereby constituting a first latch circuit. The nodes N1 and N3 are set equal to respective signal levels opposite to each other due to latch operations when the first latch is placed in a stable state.

Further, the two nodes N2 and N4 that are supposed to have a 180-degree phase difference with each other are connected through the inverters 15 and 16. Specifically, the node N2 is connected to the output of the inverter 16 and to the input of the inverter 15, and the node N4 is connected to the input of the inverter 16 and to the output of the inverter 15. In this manner, either one of the inverters 15 and 16 provides its output to the input of the other, thereby constituting a second latch circuit. The nodes N2 and N4 are set equal to respective signal levels opposite to each other due to latch operations when the second latch is placed in a stable state.

Due to the forces produced by the first and second latches trying to move into the stable state, the signal levels of the nodes N1, N2, N3, and N4 are set to, for example, LOW, HIGH, HIGH, and LOW, respectively, as illustrated in FIG. 1. From this state, the HIGH level of the node N2 propagates through the inverters 13 to appear as the inverted-level LOW at the node N3. As a result, the node N3 changes from the HIGH state illustrated in FIG. 1 to the next LOW state. Similarly, the LOW level of the node N4 propagates through the inverters 11 to appear as the inverted-level HIGH at the node N1. As a result, the node N1 changes from the LOW state illustrated in FIG. 1 to the next HIGH state. When this happens, the transition of the node N1 and the transition of the node N3 occur simultaneously due to the operation of the first latch comprised of the inverters 17 and 18.

Further, the HIGH level of the node N1 propagates through the inverters 12 to appear as the inverted-level LOW at the node N2. As a result, the node N2 changes from the HIGH state illustrated in FIG. 1 to the next LOW state. Similarly, the LOW level of the node N3 propagates through the inverters 14 to appear as the inverted-level HIGH at the node N4. As a result, the node N4 changes from the LOW state illustrated in FIG. 4 to the next HIGH state. When this happens, the transition of the node N2 and the transition of the node N4 occur simultaneously due to the operation of the second latch comprised of the inverters 15 and 16.

After this, signal level transitions successively occur in a similar manner, so that four clock signals appear at the nodes N1 through N4, respectively. The inverters 11 through 14 may have the same number of stages and the same delay time. In such a case, the four clock signals appearing at the nodes N1 through N4 are four-phase clock signals having the 0-degree phase, the 90-degree phase, the 180-degree phase, and the 270-degree phase, respectively.

Figure 2:
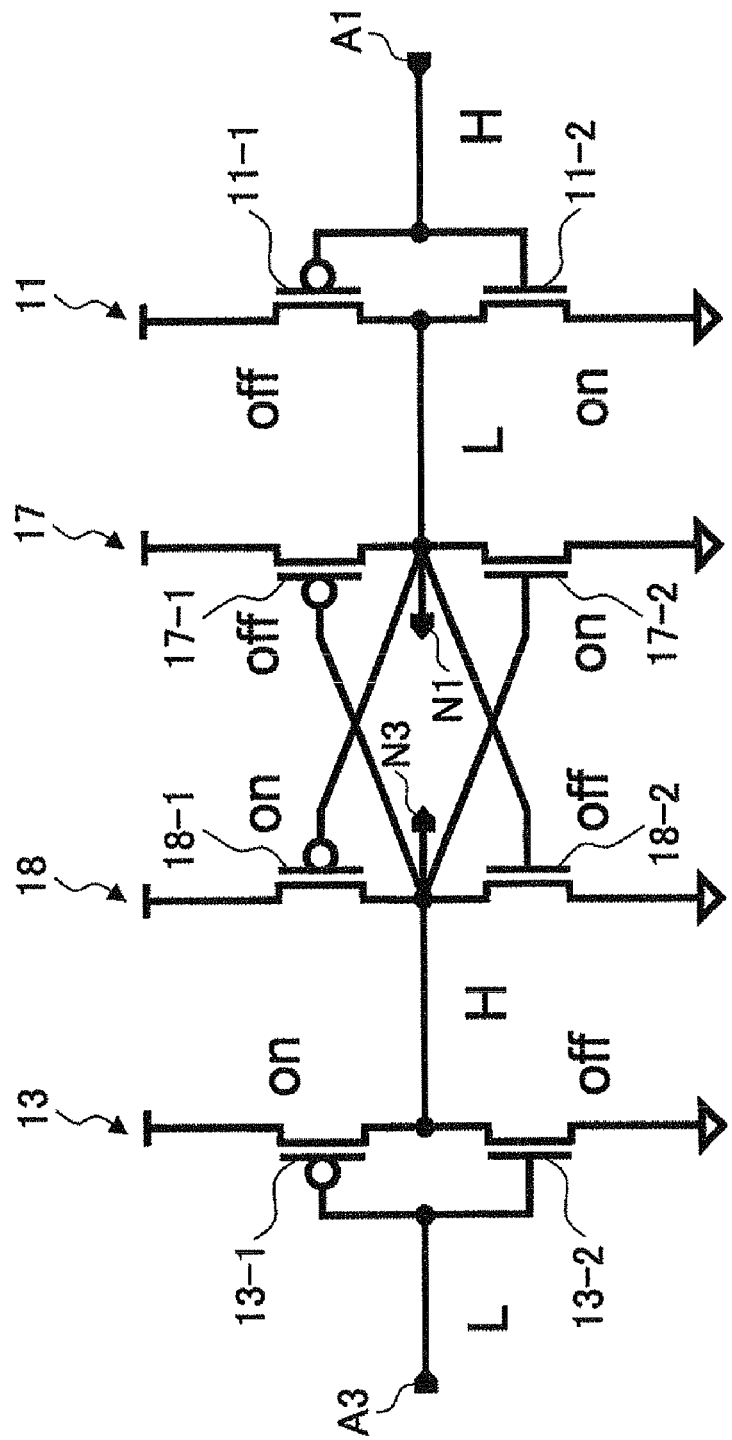
FIG. 2 is a drawing for explaining the problem of the ring oscillator circuit having the configuration illustrated in FIG. 1.

FIG. 2 is a drawing for explaining the problem of the ring oscillator circuit having the configuration illustrated in FIG. 1. FIG. 2 illustrates the inverter 11 of FIG. 1 whose output is connected to the node N1, the inverter 17 of FIG. 1 whose output is connected to the same node N1, the inverter 13 of FIG. 1 whose output is connected to the node N3, and the inverter 18 of FIG. 1 whose output is connected to the same node N3. The inverter 11 includes a PMOS transistor 11-1 and an NMOS transistor 11-2. The inverter 13 includes a PMOS transistor 13-1 and an NMOS transistor 13-2. The inverter 17 includes a PMOS transistor 17-1 and an NMOS transistor 17-2. The inverter 18 includes a PMOS transistor 18-1 and an NMOS transistor 18-2.

The on and off states of the transistors and the signal levels at respective nodes illustrated in FIG. 2 correspond to the signal levels illustrated in FIG. 1. That is, the node N1 is LOW, and the node N3 is HIGH. In this state, the LOW level of the node N4 propagates through the inverters 11, resulting in the input node of the last-stage inverter 11 (i.e., the inverter 11 illustrated in FIG. 2) being changed to LOW. Likewise, the HIGH level of the node N2 propagates through the inverters 13, resulting in the input node of the last-stage inverter 13 (i.e., the inverter 13 illustrated in FIG. 2) being changed to HIGH. The states of signal levels after the above-noted transitions are illustrated in FIG. 3.

Figure 3:
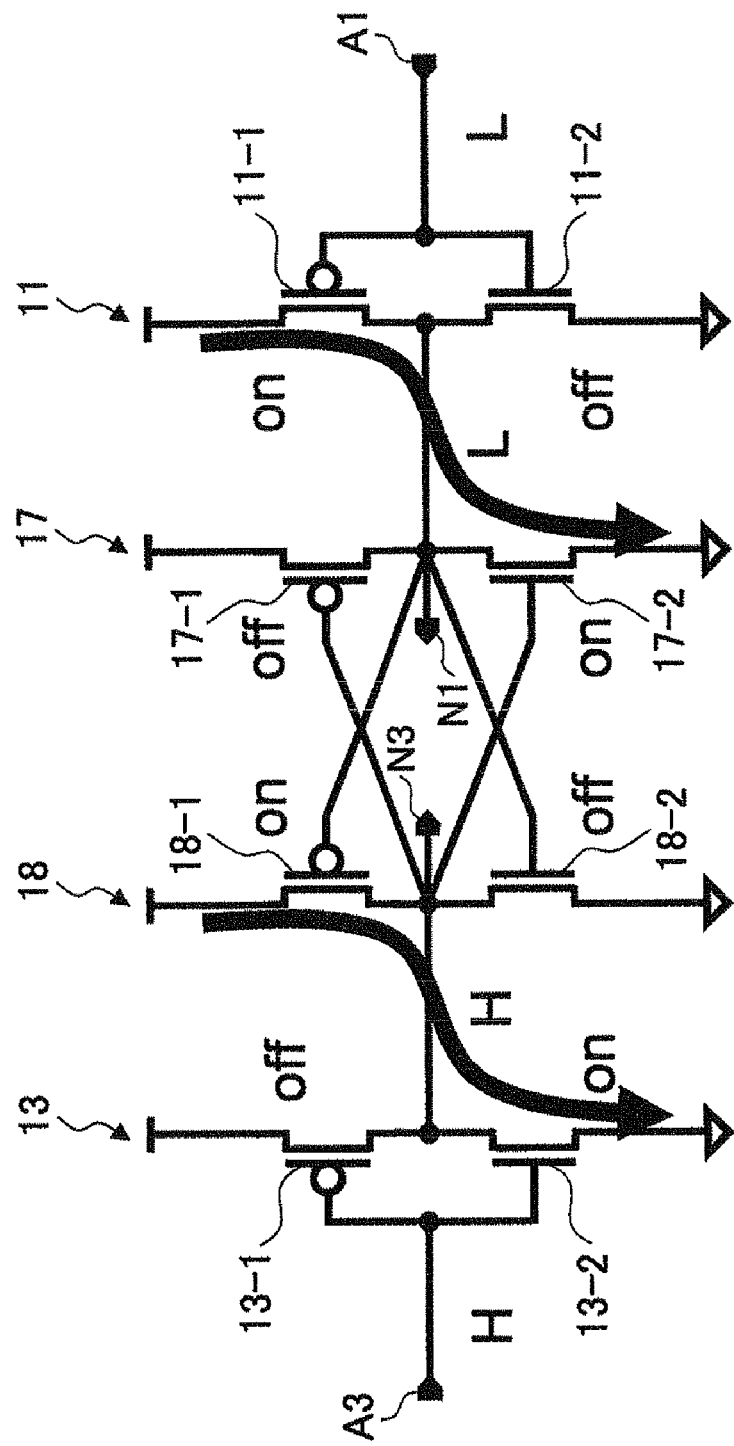
FIG. 3 is a drawing illustrating signal transitions in the circuit illustrated in FIG. 2.

In the state immediately after the input node A1 of the inverter 11 is changed to LOW in FIG. 3, the node N1 that is the output node of the inverter 11 still remains LOW, which is the signal level of the immediately preceding state. In this state, the PMOS transistor 11-1 and the NMOS transistor 17-2 are placed in the conductive state, thereby causing a large through current to flow as illustrated by an arrow in FIG. 3. In the state immediately after the input node A3 of the inverter 13 is changed to HIGH in FIG. 3, the node N3 that is the output node of the inverter 13 still remains HIGH, which is the signal level of the immediately preceding state. In this state, the PMOS transistor 18-1 and the NMOS transistor 13-2 are placed in the conductive state, thereby causing a large through current to flow as illustrated by an arrow in FIG. 3.

The output drive power of the inverter 11 and the output driver power of the inverter 13 are designed such that the output driver powers of these two inverters are combined to produce a driver power sufficient to reverse the state of the first latch comprised of the inverters 17 and 18. In the state illustrated in FIG. 3, both the inverter 11 and the inverter 13 drive the output nodes N1 and N3 in such a direction as to reverse the state of the latch. As a result, the state of the first latch ends up being reversed. When the node N1 and the node N3 become HIGH and LOW, respectively, due to the reversal of the first-latch state, the above-noted through current does not flow any longer.

It may be noted that provision is made such that either one of the output drive power of the inverter 11 and the output driver power of the inverter 13 is not sufficient to reverse the state of the first latch comprised of the inverters 17 and 18. Namely, the state of the latch is not reversed when a signal drive power for state reversal is applied to only one of the two ends of the latch. The state of the latch is reversed only after a signal driver power for state reversal is applied also to the other end of the latch. If the circuit is configured such that the state of the latch is reversed in response to a change in only one of the two ends of the latch, there is a risk of suffering a suspension of oscillation due to timing error. With the configuration in which the latch is reversed only when signal drive powers for state reversal are applied to both ends of the latch, the suspension of oscillation caused by timing error can be avoided.

As was described in connection with FIG. 3, a large through current flows when the latch is reversed. This creates needless current consumption. In particular, when a signal driver power for state reversal is applied to only one of the two ends of the latch, the state of the latch is not reversed, resulting in a prolonged period of presence of the through current.

In the following, embodiments will be described with reference to the accompanying drawings.

Figure 4:
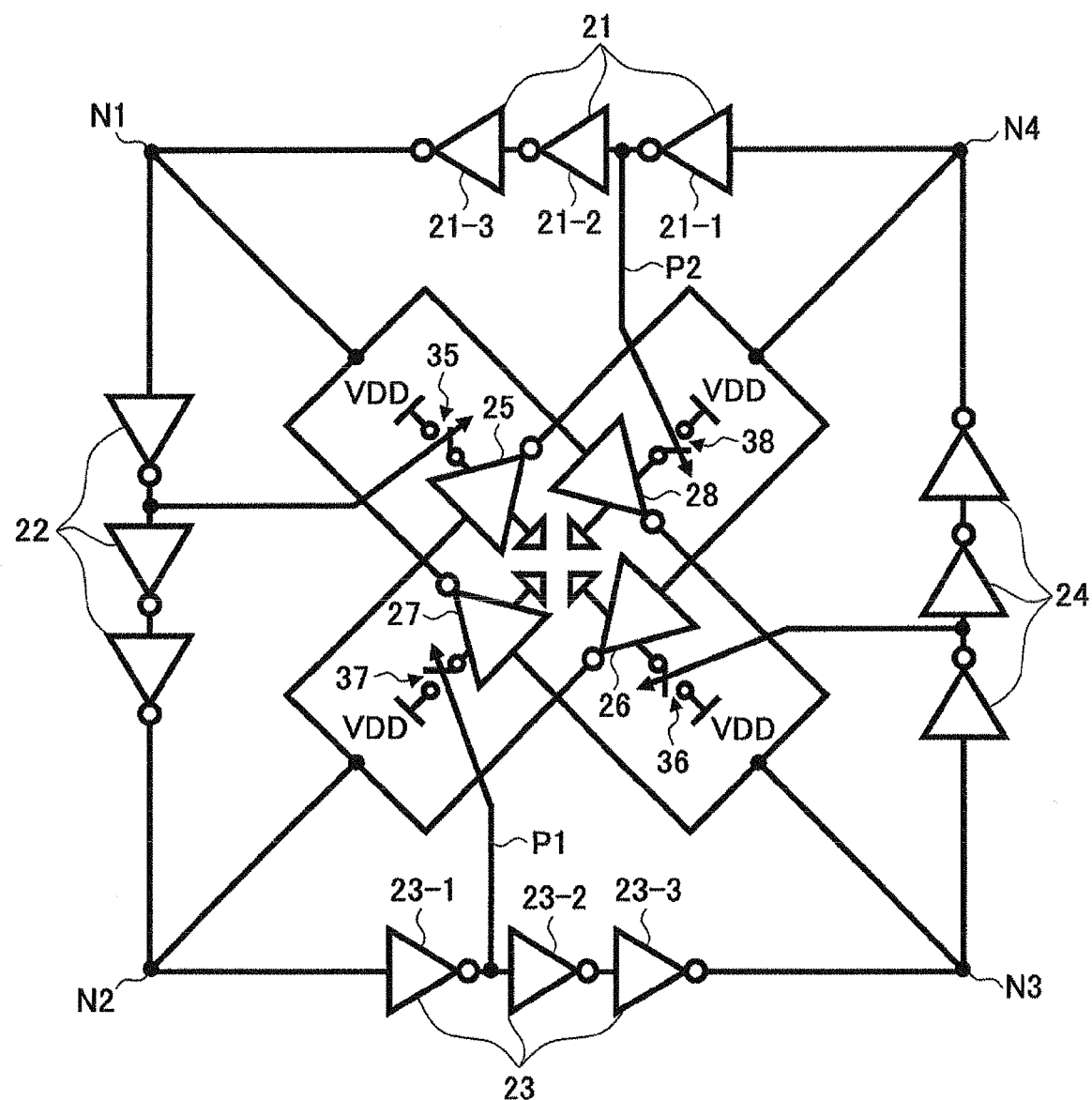
FIG. 4 is a drawing illustrating an example of the configuration of an embodiment of an even-number-stage ring oscillator circuit.

FIG. 4 is a drawing illustrating an example of the configuration of an embodiment of an even-number-stage ring oscillator circuit. The ring oscillator circuit illustrated in FIG. 4 includes a plurality of inverters 21, a plurality of inverters 22, a plurality of inverters 23, a plurality of inverters 24, and inverters 25 through 28. Although FIG. 4 illustrates an example in which the number of inverters 21 is three, the number of inverters 21 may be any number. The same applies in the case of the inverters 22, the inverters 23, and the inverters 24. In general, even-number inverters are situated between a node N1 and a node N3, and even-number inverters are situated between a node N2 and a node N4. The three inverters 21 are differentiated from each other by designating them by 21-1 though 21-3, respectively. Similarly, the three inverters 23 are differentiated from each other by designating them by 23-1 though 23-3, respectively.

In respect of the inverters 21 through 24, the output of any given stage is connected to the input of the next following stage to constitute a loop. In FIG. 4, the last output node of the inverters 21 is denoted as the node N1, the last output node of the inverters 22 denoted as the node N2, the last output node of the inverters 23 denoted as the node N3, and the last output node of the inverters 24 denoted as the node N4. In the configuration illustrated in FIG. 4, further, the two nodes N1 and N3 that are supposed to have a 180-degree phase difference with each other are connected through the inverters 27 and 28. Specifically, the node N1 is connected to the output of the inverter 27 and to the input of the inverter 28, and the node N3 is connected to the input of the inverter 27 and to the output of the inverter 28. In this manner, either one of the inverters 27 and 28 provides its output to the input of the other, thereby constituting a first latch circuit. The nodes N1 and N3 are set equal to respective signal levels opposite to each other due to latch operations when the first latch is placed in a stable state.

Further, the two nodes N2 and N4 that are supposed to have a 180-degree phase difference with each other are connected through the inverters 25 and 26. Specifically, the node N2 is connected to the output of the inverter 26 and to the input of the inverter 25, and the node N4 is connected to the input of the inverter 26 and to the output of the inverter 25. In this manner, either one of the inverters 25 and 26 provides its output to the input of the other, thereby constituting a second latch circuit. The nodes N2 and N4 are set equal to respective signal levels opposite to each other due to latch operations when the second latch is placed in a stable state.

Due to the forces produced by the first and second latches trying to move into the stable state, the signal levels of the nodes N1, N2, N3, and N4 are set to, for example, LOW, HIGH, HIGH, and LOW, respectively, in the initial state. From this initial state, the HIGH level of the node N2 propagates through the inverters 23 to appear as the inverted-level LOW at the node N3. As a result, the node N3 changes from the initial HIGH state to the next LOW state. Similarly, the LOW level of the node N4 propagates through the inverters 21 to appear as the inverted-level HIGH at the node N1. As a result, the node N1 changes from the initial LOW state to the next HIGH state. When this happens, the transition of the node N1 and the transition of the node N3 occur simultaneously due to the operation of the first latch comprised of the inverters 27 and 28.

Further, the HIGH level of the node N1 propagates through the inverters 22 to appear as the inverted-level LOW at the node N2. As a result, the node N2 changes from the initial HIGH state to the next LOW state. Similarly, the LOW level of the node N3 propagates through the inverters 24 to appear as the inverted-level HIGH at the node N4. As a result, the node N4 changes from the initial LOW state to the next HIGH state. When this happens, the transition of the node N2 and the transition of the node N4 occur simultaneously due to the operation of the second latch comprised of the inverters 25 and 26.

After this, signal level transitions successively occur in a similar manner, so that four clock signals appear at the nodes N1 through N4, respectively. The inverters 11 through 14 may have the same number of stages and the same delay time. In such a case, the four clock signals appearing at the nodes N1 through N4 are four-phase clock signals having the 0-degree phase, the 90-degree phase, the 180-degree phase, and the 270-degree phase, respectively.

In the ring oscillator circuit illustrated in FIG. 4, each of the inverters 25 through 28 are implemented as a switch-equipped inverter, which may be selectively connected to or disconnected from a power supply line through its switching function. In FIG. 4, the switch for providing and severing connection between the inverter 25 and the power supply line is illustrated as a switch 35. The switch for providing and severing connection between the inverter 26 and the power supply line is illustrated as a switch 36. The switch for providing and severing connection between the inverter 27 and the power supply line is illustrated as a switch 37. The switch for providing and severing connection between the inverter 28 and the power supply line is illustrated as a switch 38. The switches 35 through 38 merely represent the function of selective power supply connection and disconnection in an illustrative manner. In actual circuit configuration, switching functions may be provided on both the power supply VDD side and the ground voltage VSS side.

In the following, a description will be given of the configuration that suppresses a through current at the time of latch reversal in the ring oscillator circuit of FIG. 4 by focusing attention on the two nodes N1 and N3 having a 180-degree phase difference with each other. The ring oscillator circuit illustrated in FIG. 4 is provided with a first path that has even-number inverters 22 and 23 connected in series from the first node N1 on the input side to the second node N3 on the output side. Further, a second path is provided that has even-number inverters 24 and 21 connected in series from the second node N3 on the input side to the first node N1 on the output side. Further, a latch circuit (i.e., inverters 27 and 28) is connected to the first node N1 and the second node N3 to maintain the logical value of the first node N1 and the logical value of the second node N3 at opposite states with each other. Further, control signal paths P1 and P2 supply control signals that are input into the latch circuit to provide or server electrical connection between the latch circuit and the power supply lines. These control signals are responsive to signals propagating through the first path and the second path (i.e., the ring illustrated in FIG. 4).

More specifically, the control signals include a first control signal that is output from the first predetermined inverter 23-1 selected from the even-number inverters 22 and 23 provided in the first path. Further, the control signals include a second control signal that is output from the second predetermined inverter 21-1 selected from the even-number inverters 24 and 21 provided in the second path. The first predetermined inverter 23-1 is an odd-numbered inverter other than the first inverter (e.g., third inverter in the example of FIG. 4) in the sequence of inverters in which the even-number inverters 22 and 23 are counted from the second node N3 on the first path. The second predetermined inverter 21-1 is an odd-numbered inverter other than the first inverter (e.g., third inverter in the example of FIG. 4) in the sequence of inverters in which the even-number inverters 24 and 21 are counted from the first node N1 on the second path.

The first control signal supplied through the control signal path P1 controls an electrical coupling between the inverter 27 and the power supply line. The second control signal supplied through the control signal path P2 controls an electrical coupling between the inverter 28 and the power supply line.

Figure 5:
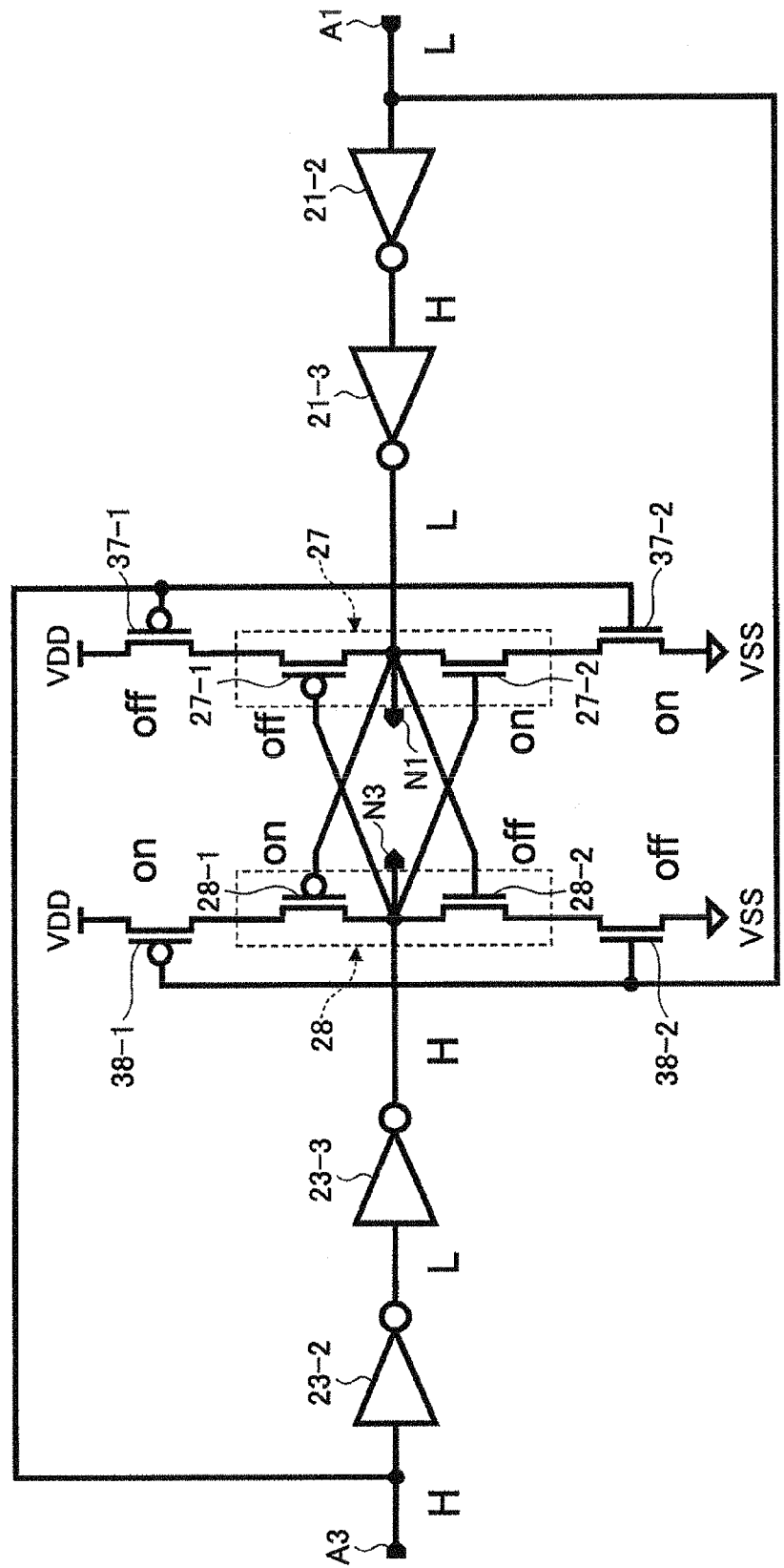
FIG. 5 is a drawing for explaining the configuration that suppresses a through current at the time of latch reversal by focusing attention on the two nodes N1 and N3 illustrated in FIG. 4.

FIG. 5 is a drawing for explaining the configuration that suppresses a through current at the time of latch reversal by focusing attention on the two nodes N1 and N3 illustrated in FIG. 4. In FIG. 5, the same elements as those of FIG. 4 are referred to by the same numerals, and a description thereof will be omitted.

FIG. 5 illustrates the inverter 21-3 of FIG. 4 whose output is connected to the node N1, the inverter 27 of FIG. 4 whose output is connected to the same node N1, the inverter 23-3 of FIG. 4 whose output is connected to the node N3, and the inverter 28 of FIG. 4 whose output is connected to the same node N3. FIG. 5 also illustrates the inverter 21-2 preceding the inverter 21-3, and illustrates the inverter 23-2 preceding the inverter 23-3.

The inverter 27 includes a PMOS transistor 27-1 and an NMOS transistor 27-2. The inverter 28 includes a PMOS transistor 28-1 and an NMOS transistor 28-2. A PMOS transistor 37-1 and an NMOS transistor 37-2 correspond to the switch 37 illustrated in FIG. 2. A PMOS transistor 38-1 and an NMOS transistor 38-2 correspond to the switch 38 illustrated in FIG. 2.

The PMOS transistor 37-1 is situated between the inverter 27 and the power supply voltage VDD, and the NMOS transistor 37-2 is situated between the inverter 27 and the ground voltage VSS. The conductive and nonconductive states of the PMOS transistor 37-1 and the NMOS transistor 37-2 are controlled to provide and server connections between the power supply lines and the inverter 27. Similarly, the PMOS transistor 38-1 is situated between the inverter 28 and the power supply voltage VDD, and the NMOS transistor 38-2 is situated between the inverter 28 and the ground voltage VSS. The conductive and nonconductive states of the PMOS transistor 38-1 and the NMOS transistor 38-2 are controlled to provide and server connections between the power supply lines and the inverter 28.

The on and off states of the transistors and the signal levels at respective nodes illustrated in FIG. 5 correspond to the state in which the node N1 is LOW, and the node N3 is HIGH. From this state, the LOW level of the node N4 causes the output node A1 of the inverter 21-1 (see FIG. 4) to change to HIGH. Similarly, the HIGH level of the node N2 causes the output node A3 of the inverter 23-1 (see FIG. 4) to change to LOW. The states of signal levels after the above-noted transitions are illustrated in FIG. 6.

Figure 6:
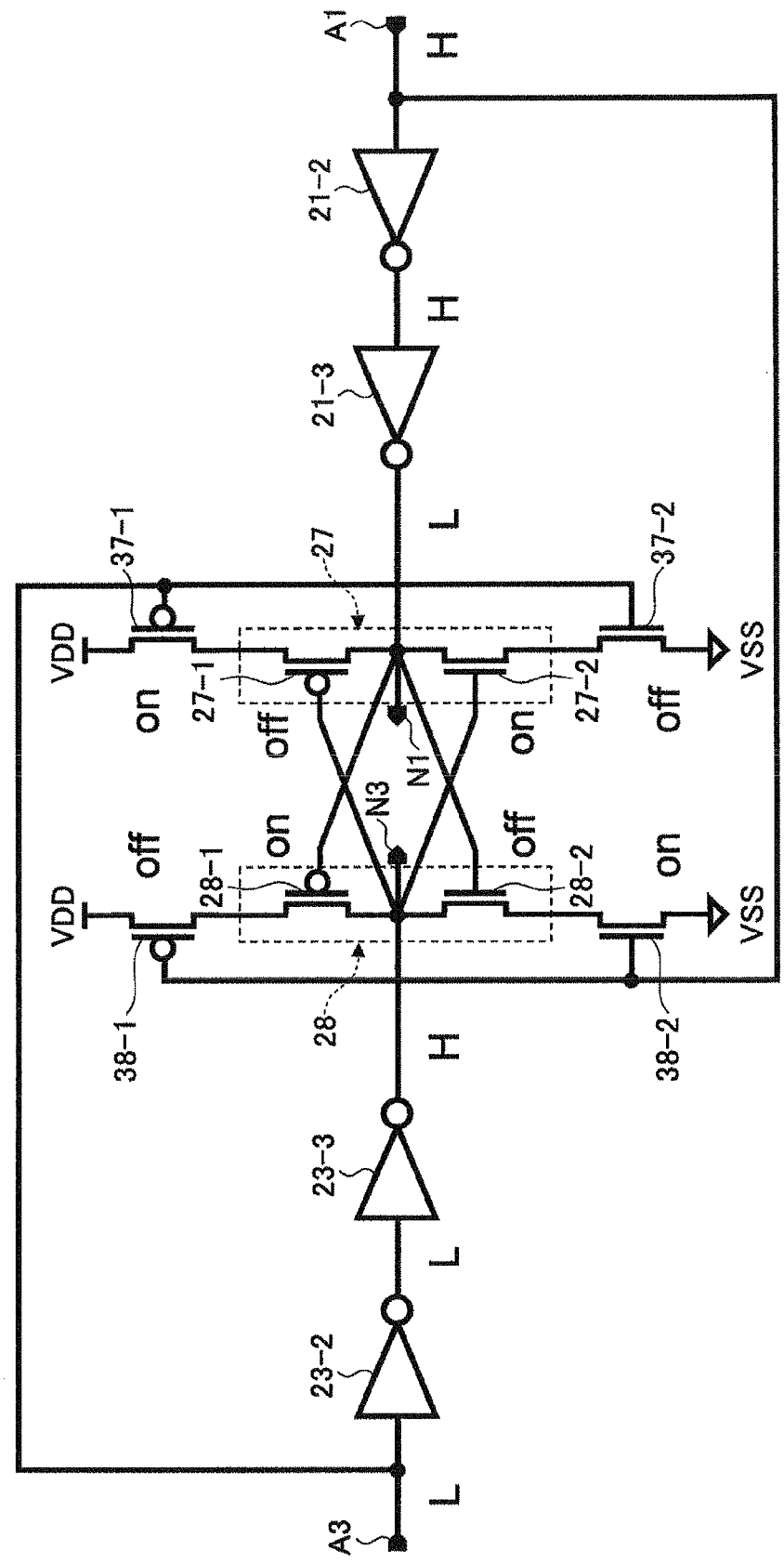
FIG. 6 is a drawing illustrating signal transitions in the circuit illustrated in FIG. 5.

In the state immediately after the input node A1 of the inverter 21-2 is changed to HIGH in FIG. 6, the output signal level of the inverter 21-2 still remains HIGH, which is the signal level of the immediately preceding state. The change to HIGH of the input node A1 causes the PMOS transistor 38-1 to change to a nonconductive state (i.e., off state), and also causes the NMOS transistor 38-2 to change to a conductive state (i.e., on state). When this happens, the PMOS transistor 28-1 of the inverter 28 is in a conductive state (i.e., on state), and the NMOS transistor 28-2 of the inverter 28 is in a nonconductive state (i.e., off state). Accordingly, the drive power of the inverter 28 to drive the node N3 is zero.

Similarly, in the state immediately after the input node A3 of the inverter 23-2 is changed to LOW in FIG. 6, the output signal level of the inverter 23-2 still remains LOW, which is the signal level of the immediately preceding state. The change to LOW of the input node A3 causes the PMOS transistor 37-1 to change to a conductive state (i.e., on state), and also causes the NMOS transistor 37-2 to change to a nonconductive state (i.e., off state). When this happens, the PMOS transistor 27-1 of the inverter 27 is in a nonconductive state (i.e., off state), and the NMOS transistor 27-2 of the inverter 27 is in a conductive state (i.e., on state). Accordingly, the drive power of the inverter 27 to drive the node N1 is zero.

In this state, the latch comprised of the inverters 27 and 28 is disconnected from the power supply. That is, the latch function of this latch is in a suspended state.

Subsequently, the output of the inverter 21-2 changes to LOW in response to HIGH at the node A1. Similarly, the output of the inverter 23-2 changes to HIGH in response to LOW at the node A3. The states of signal levels after the above-noted transitions are illustrated in FIG. 7.

Figure 7:
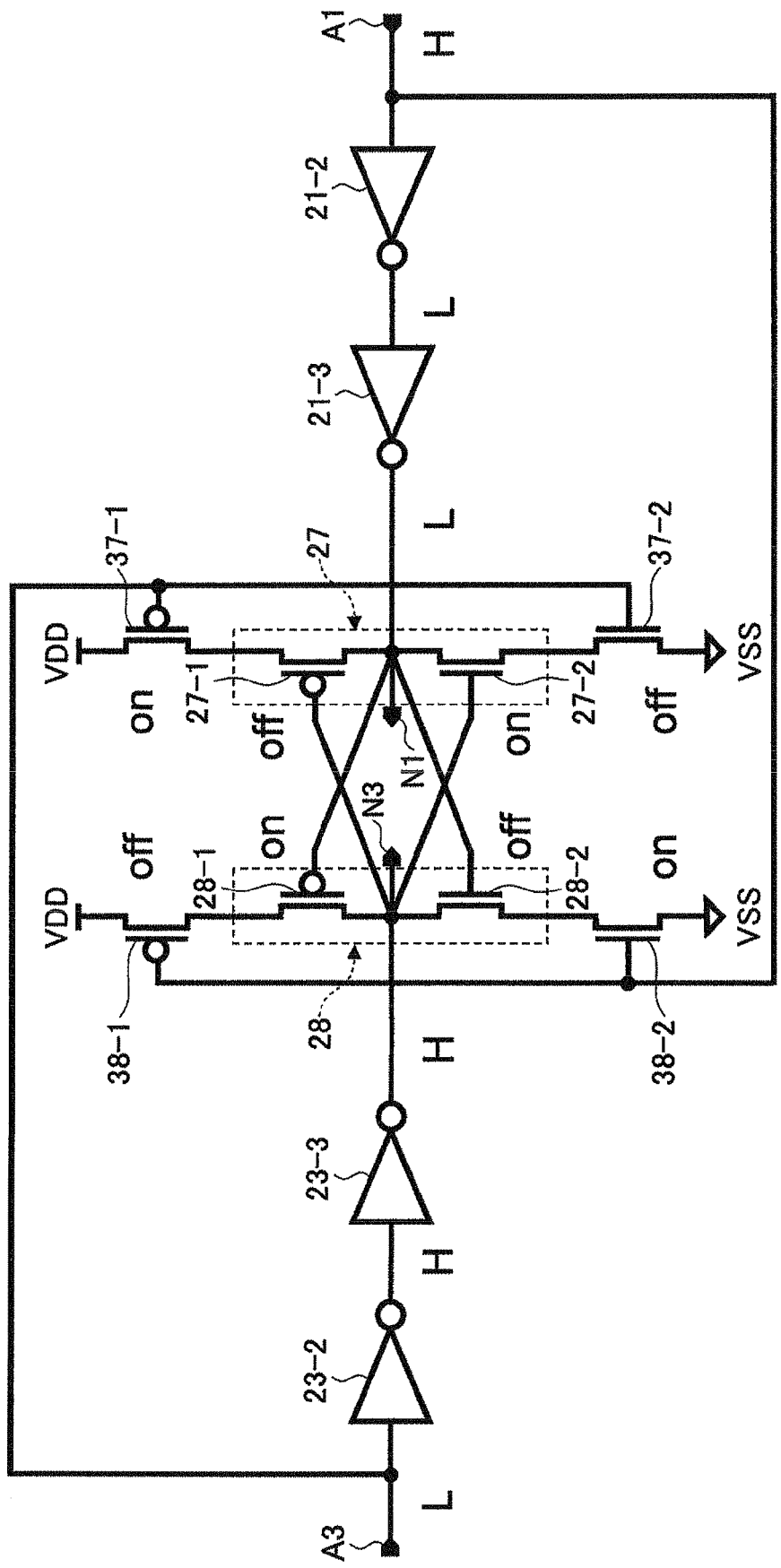
FIG. 7 is a drawing illustrating signal transitions in the circuit illustrated in FIG. 5.

In FIG. 7, the inverter 21-3 drives its output to raise the output signal level in response to LOW at the input of the inverter 21-3. Namely, the output of the inverter 21-3 is coupled to the power supply voltage VDD through the PMOS transistor inside the inverter 21-3. If the nonconductive-state NMOS transistor 37-2 was not provided, a through current would flow from the inverter 21-3 to the ground potential VSS through the conductive-state NMOS transistor 27-2. In the configuration of the present embodiment, the NMOS transistor 37-2 is placed in the nonconductive state, so that there is no through current.

Similarly, in FIG. 7, the inverter 23-3 drives its output to lower the output signal level in response to HIGH at the input of the inverter 23-3. Namely, the output of the inverter 23-3 is coupled to the ground voltage VSS through the NMOS transistor inside the inverter 23-3. If the nonconductive-state PMOS transistor 38-1 was not provided, a through current would flow from the conductive-state PMOS transistor 28-1 to the ground potential VSS through the inverter 23-3. In the configuration of the present embodiment, the PMOS transistor 38-1 is placed in the nonconductive state, so that there is no through current.

As previously described, the latch comprised of the inverters 27 and 28 is disconnected from the power supply, so that its latch function is in the suspended state. When the inverter 21-3 drives its output to raise the output signal level to HIGH, therefore, the node N1 immediately changes to HIGH. Similarly, when the inverter 23-3 drives its output to lower the output signal level to LOW, the node N3 immediately changes to LOW. The states of signal levels after the above-noted transitions are illustrated in FIG. 8.

Figure 8:
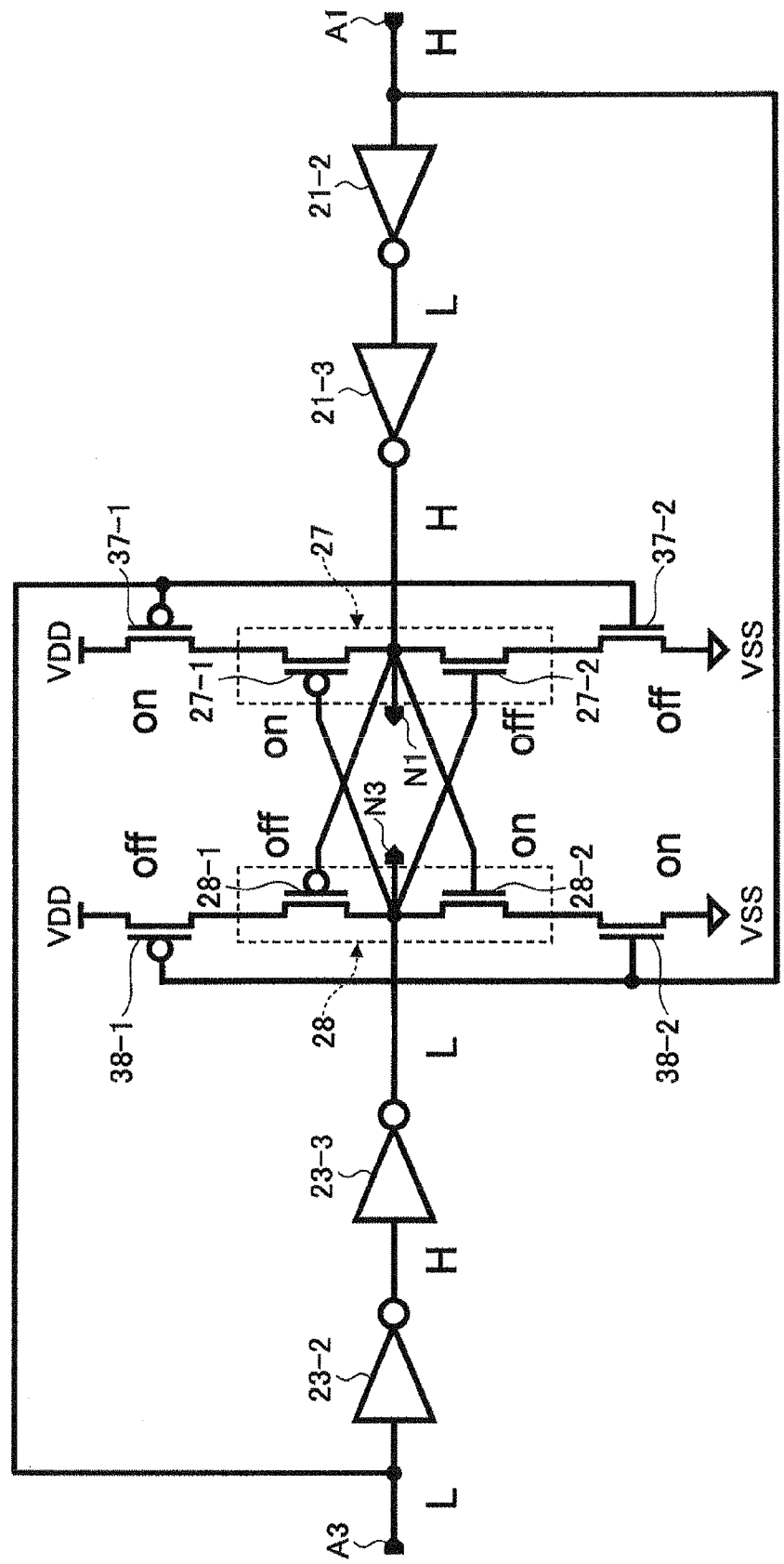
FIG. 8 is a drawing illustrating signal transitions in the circuit illustrated in FIG. 5.

As illustrated in FIG. 8, the change to HIGH of the node N1 causes the NMOS transistor 28-2 to be conductive, thereby connecting the inverter 28 to the ground potential VSS. Further, the change to LOW of the node N3 causes the PMOS transistor 27-1 to be conductive, thereby connecting the inverter 27 to the power supply potential VDD. As the signal levels of the latch at the opposite end nodes thereof are reversed from their original states as described above, the latch is coupled to the power supply again.

The connection between the inverters 27 and 28 and the power supply is provided and severed in response to a signal responsive to a signal propagating through a ring as described above, thereby suppressing a through current at the time of latch reversal. Specifically, the inverter 28 is disconnected from the power supply prior to a change in the output logical value of the inverter 23-3 that is the last stage inverter of the first path. This arrangement suppresses a through current that would flow at the time the inverter 23-3 drives its output to change its output logical value. Similarly, the inverter 27 is disconnected from the power supply prior to a change in the output logical value of the inverter 21-3 that is the last stage inverter of the second path. This arrangement suppresses a through current that would flow at the time the inverter 21-3 drives its output to change its output logical value.

As was described in connection with a ring oscillator circuit illustrated in FIG. 1, if the circuit is configured such that the state of the latch is reversed in response to a change in only one of the two ends of the latch, there is a risk of suffering a suspension of oscillation due to timing error. The ring oscillator circuit illustrated in FIG. 1 uses the configuration in which the latch is reversed only when signal drive powers for state reversal are applied to both ends of the latch, thereby avoiding the suspension of oscillation caused by timing error. In the following, a description will be given of the act that the ring oscillator circuit of FIG. 4 can also avoid the suspension of oscillation caused by timing error.

Figure 9:
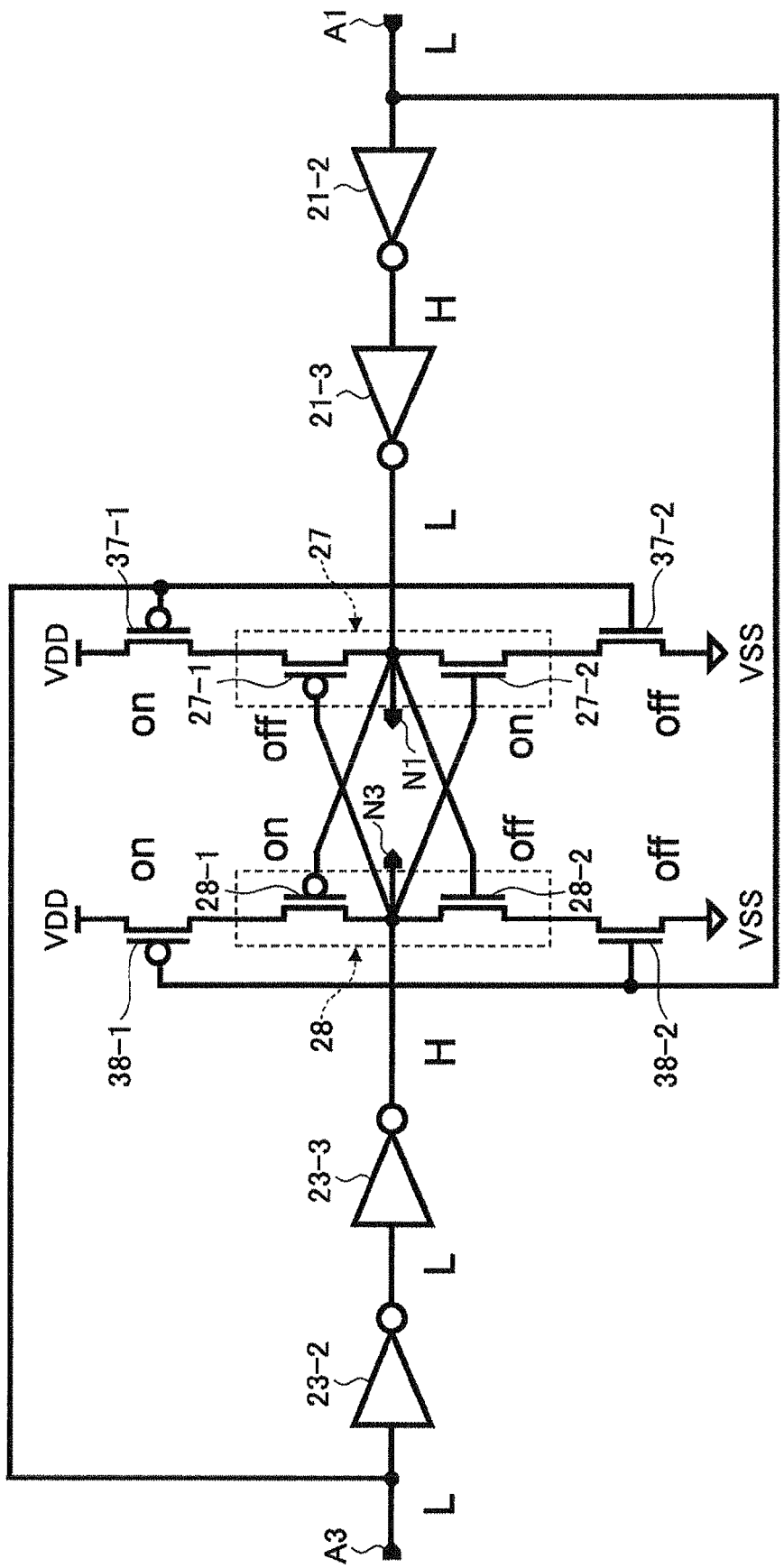
FIG. 9 is a drawing for explaining that a latch state is not reversed in response to a change in only one of the two ends of the latch.

FIG. 9 is a drawing for explaining that a latch state is not reversed in response to a change in only one of the two ends of the latch. In FIG. 9, the same elements as those of FIG. 4 are referred to by the same numerals, and a description thereof will be omitted.

The on and off states of the transistors and the signal levels at respective nodes illustrated in FIG. 9 correspond to the signal levels that are observed immediately after the signal level of the node A3 is changed from HIGH to LOW from the state illustrated in FIG. 5. In the state immediately after the input node A3 of the inverter 23-2 is changed to LOW, the output signal level of the inverter 23-2 still remains LOW, which is the signal level of the immediately preceding state. The change to LOW of the input node A3 causes the PMOS transistor 37-1 to change to a conductive state (i.e., on state), and also causes the NMOS transistor 37-2 to change to a nonconductive state (i.e., off state). When this happens, the PMOS transistor 27-1 of the inverter 27 is in a nonconductive state (i.e., off state), and the NMOS transistor 27-2 of the inverter 27 is in a conductive state (i.e., on state). Accordingly, the drive power of the inverter 27 to drive the node N1 is zero.

The input node A1 remains LOW in this example, so that the PMOS transistor 38-1 is in a conductive state (i.e., on state), and the NMOS transistor 38-2 is in a nonconductive state (i.e., off state). Further, the PMOS transistor 28-1 of the inverter 28 is in a conductive state (i.e., on state), and the NMOS transistor 28-2 of the inverter 28 is in a nonconductive state (i.e., off state). Accordingly, the inverter 28 drives the node N3 to maintain the node N3 at HIGH.

In this state, the output of the inverter 23-2 changes to HIGH in response to LOW at the node A3. The states of signal levels after the above-noted transition are illustrated in FIG. 10.

Figure 10:
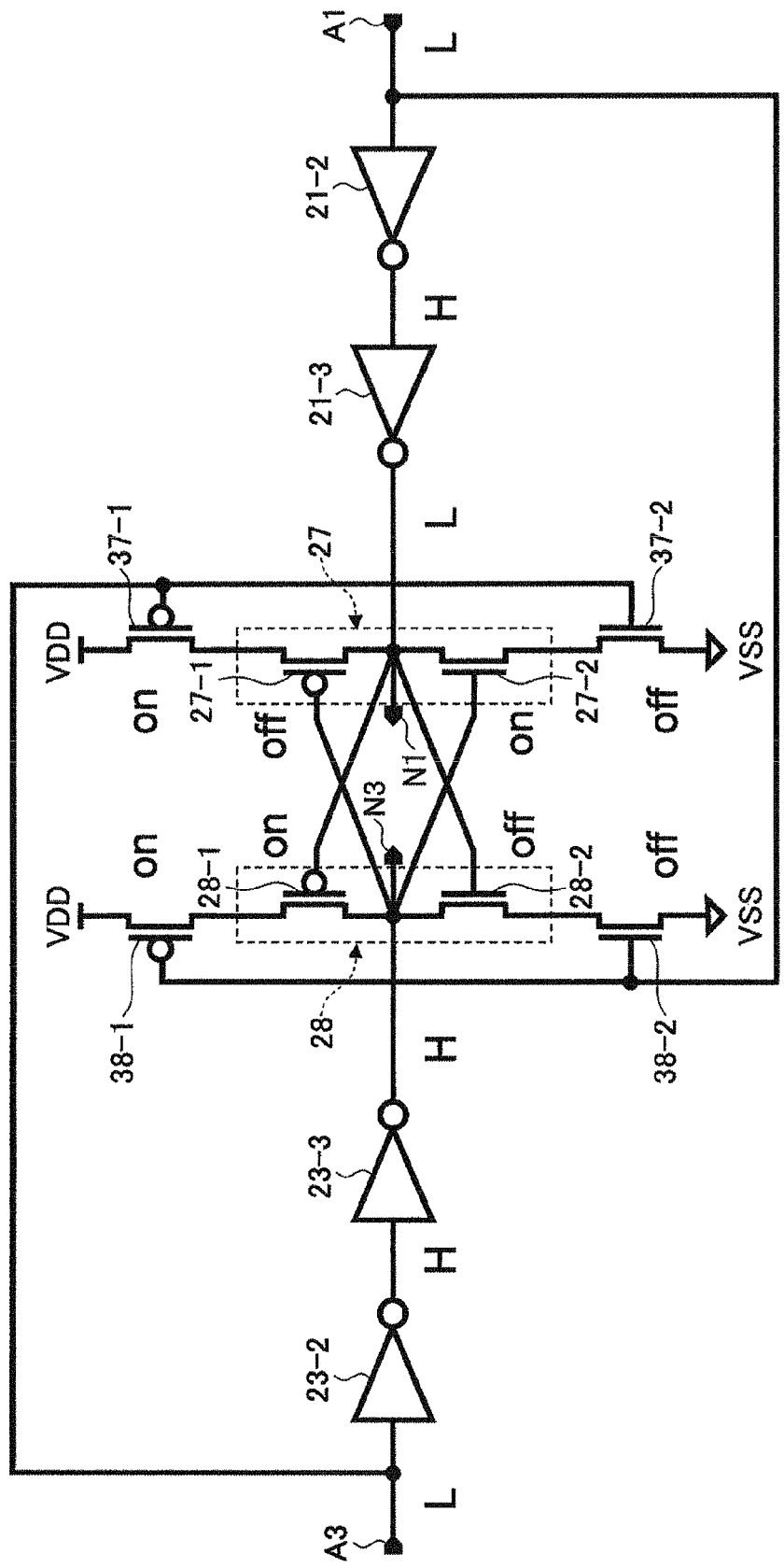
FIG. 10 is a drawing illustrating signal transitions in the circuit illustrated in FIG. 9.

In FIG. 10, the inverter 23-3 drives its output to lower the output signal level to LOW in response to HIGH at the input of the inverter 23-3. Namely, the output of the inverter 23-3 is coupled to the ground voltage VSS through the NMOS transistor inside the inverter 23-3. When this happens, the inverter 28 is driving the node N3 to maintain the node N3 at HIGH. The output drive direction of the inverter 23-3 and the output drive direction of the inverter 28 are opposite to each other, resulting in a clash at the node N3 between these inverters' drive powers.

In the ring oscillator circuit illustrated in FIG. 4, the inverter 28 is designed to have a larger drive capacity than the drive capacity of the inverter 23-3 that is the last stage of the plural inverters situated on the first path. When the drive output powers of the inverter 23-3 and the inverter 28 clash with each other as illustrated in FIG. 10, therefore, the output drive power of the inverter 28 prevails. As a result, the latch comprised of the inverters 27 and 28 is not reversed. Namely, the latch state is not reversed when a drive power for latch state reversal is applied only to the node N3.

Similarly, the inverter 27 is designed to have a larger drive capacity than the drive capacity of the inverter 21-3 that is the last stage of the plural inverters situated on the second path. As a result, the latch state is not reversed when a drive power for latch state reversal is applied only to the node N1.

As was described in connection with FIG. 6 through FIG. 8, on the other hand, the latch state is reversed when drive powers for latch state reversal are applied to the two ends of the latch (i.e., nodes N1 and N3). This is because the latch function is temporarily suspended due to the working of the control signals. As can be understood from the above description, the inverter 28 is disconnected from the power supply when an effect of a signal change reaches the node A1 in the configuration illustrated in FIG. 4. In the state in which the drive output powers of the inverter 23-3 and the inverter 28 clash with each other as illustrated in FIG. 10, therefore, the arrival of an effect of an opposite-side signal change at the node A1 causes an immediate reversal in the latch state. In this case, the latch state changes before the effect of a signal change arrives at the node N1. There is thus a timing displacement that is equal to the time length required for a signal to propagate from the node A1 to node N1. In order to avoid the suspension of oscillation caused by timing error, it is preferable to change the latch state at the time the signal changes arrive at both the node N1 and the node N3. However, the timing displacement that is equal to the time length required for a signal to propagate from the node A1 to the node N1 can be made sufficiently short to avoid the suspension of oscillation. This timing displacement thus does not cause a problem.

Figure 11:
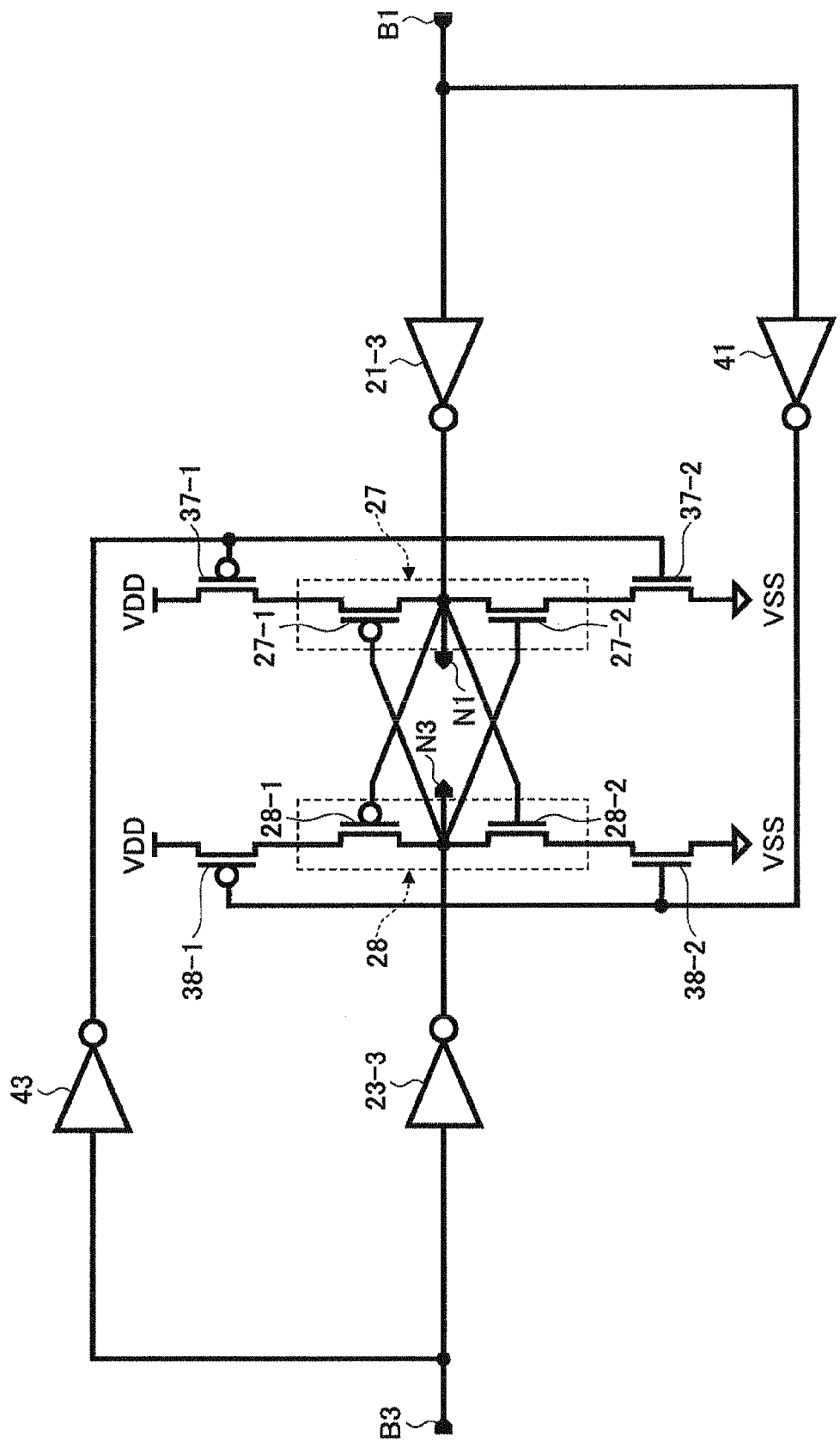
FIG. 11 is a drawing illustrating a variation of the embodiment of the ring oscillator circuit.

FIG. 11 is a drawing illustrating a variation of the embodiment of the ring oscillator circuit. The variation illustrated in FIG. 11 relates to the control of power supply to the latch, and the illustration is given by focusing attention on the node N1 and the node N3 illustrated in FIG. 4. In FIG. 11, the same elements as those of FIG. 4 and FIG. 5 are referred to by the same numerals, and a description thereof will be omitted.

FIG. 11 illustrates the inverter 21-3 of FIG. 4 whose output is connected to the node N1, the inverter 27 of FIG. 4 whose output is connected to the same node N1, the inverter 23-3 of FIG. 4 whose output is connected to the node N3, and the inverter 28 of FIG. 4 whose output is connected to the same node N3. A PMOS transistor 37-1 and an NMOS transistor 37-2 correspond to the switch 37 illustrated in FIG. 2. A PMOS transistor 38-1 and an NMOS transistor 38-2 correspond to the switch 38 illustrated in FIG. 2.

In the embodiment illustrated in FIG. 5, the output signal of the inverter 21-1 and the output signal of the inverter 23-1 are used as the control signals to provide and sever a connection between the power supply and the latch comprised of the inverters 27 and 28. In the variation illustrated in FIG. 11, an inverter 41 that shares an input node B1 with the inverter 21-3 is provided, and the output signal of the inverter 41 controls the PMOS transistor 38-1 and the NMOS transistor 38-2 of the switch 38. Further, an inverter 43 that shares an input node B3 with the inverter 23-3 is provided, and the output signal of the inverter 43 controls the PMOS transistor 37-i and the NMOS transistor 37-2 of the switch 37.

The delay time of the inverter 41 may be comparable to the delay time of the inverter 21-3, and may preferably be shorter than the delay time of the inverter 21-3. The delay time of the inverter 43 may be comparable to the delay time of the inverter 23-3, and may preferably be shorter than the delay time of the inverter 23-3.

Signal changes may arrive at the nodes B1 and B2 substantially at the same time. The delay time of the inverter 21-3 and the delay time of the inverter 23-3 may be substantially equal to each other. In this case, the output drive power of the inverter 28 changes to zero substantially at the same timing as or prior to the timing at which the inverter 23-3 attempts to change its output. Accordingly, a through current is suppressed. Further, the output drive power of the inverter 27 changes to zero substantially at the same timing as or prior to the timing at which the inverter 21-3 attempts to change its output. Accordingly, a through current is suppressed.

Figure 12:
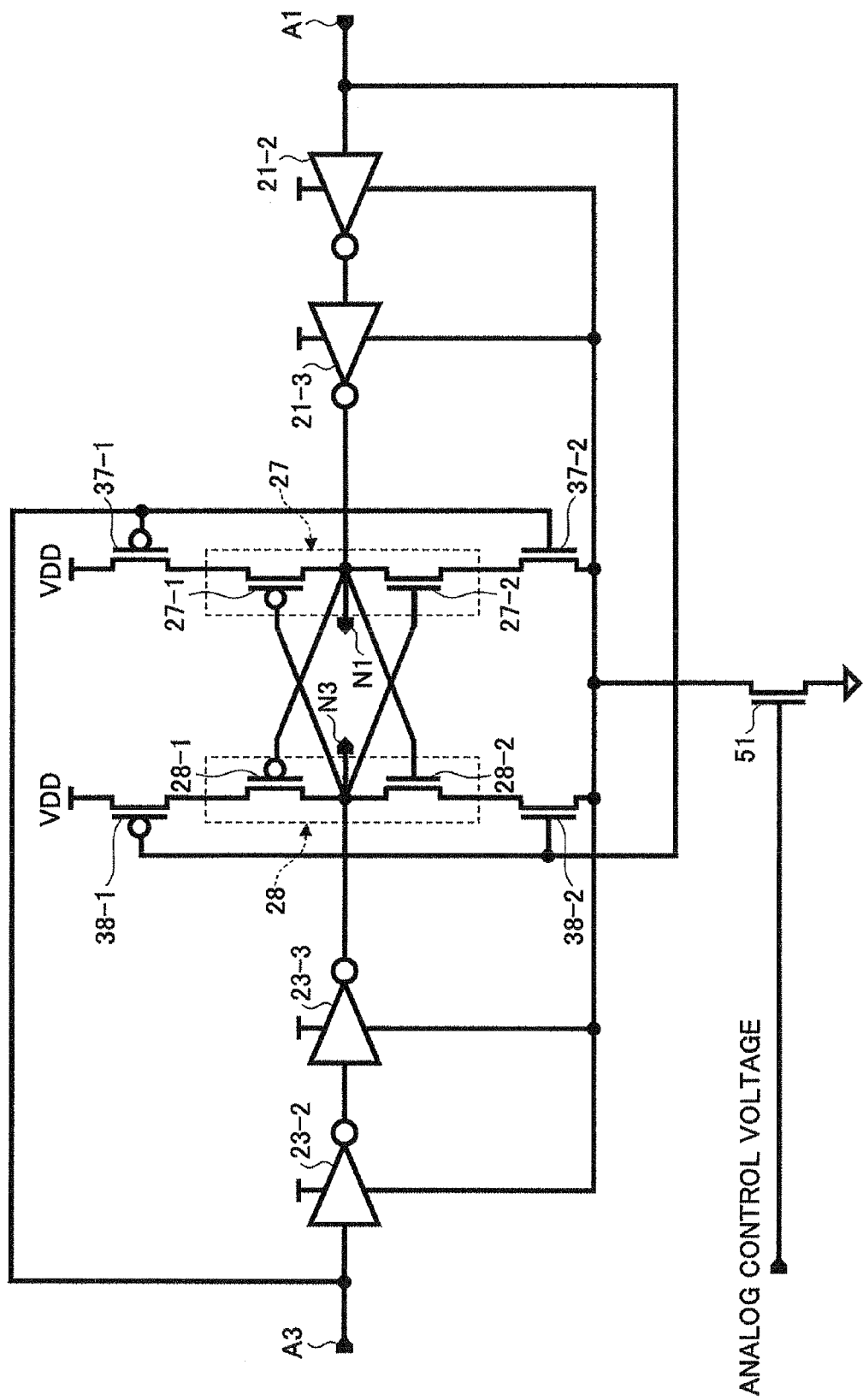
FIG. 12 is a drawing illustrating an embodiment of the ring oscillator circuit used as a VCO.

FIG. 12 is a drawing illustrating an embodiment of the ring oscillator circuit used as a VCO. FIG. 12 illustrates a scheme in which an oscillating frequency is controlled in response to a voltage signal in the configuration illustrated in FIG. 5. In FIG. 12, the same elements as those of FIG. 4 and FIG. 5 are referred to by the same numerals, and a description thereof will be omitted.

In the configuration illustrated in FIG. 12, an NMOS transistor 51 for current control is provided on a path that consolidates the power supply currents of respective inverters used in the ring oscillator circuit, thereby utilizing the ring oscillator circuit as a VCO. The gate of the NMOS transistor 51 receives an analog control voltage. An increase in the analog control voltage causes an electric current flowing in the NMOS transistor 51 to increase, thereby increasing the output drive power of each inverter. As a result, the oscillating frequency of the ring oscillator circuit increases. Conversely, a decrease in the analog control voltage causes an electric current flowing in the NMOS transistor 51 to decrease, thereby decreasing the output drive power of each inverter. As a result, the oscillating frequency of the ring oscillator circuit decreases. In this manner, the oscillating frequency of the ring oscillator circuit is controlled by adjusting the analog control voltage applied from an external source. It may be noted that the NMOS transistor 51 may be provided in one or more paths through which power-supply currents flow from all the inverters illustrated in FIG. 4, rather than from only the inverters illustrated in FIG. 12.

Figure 13:
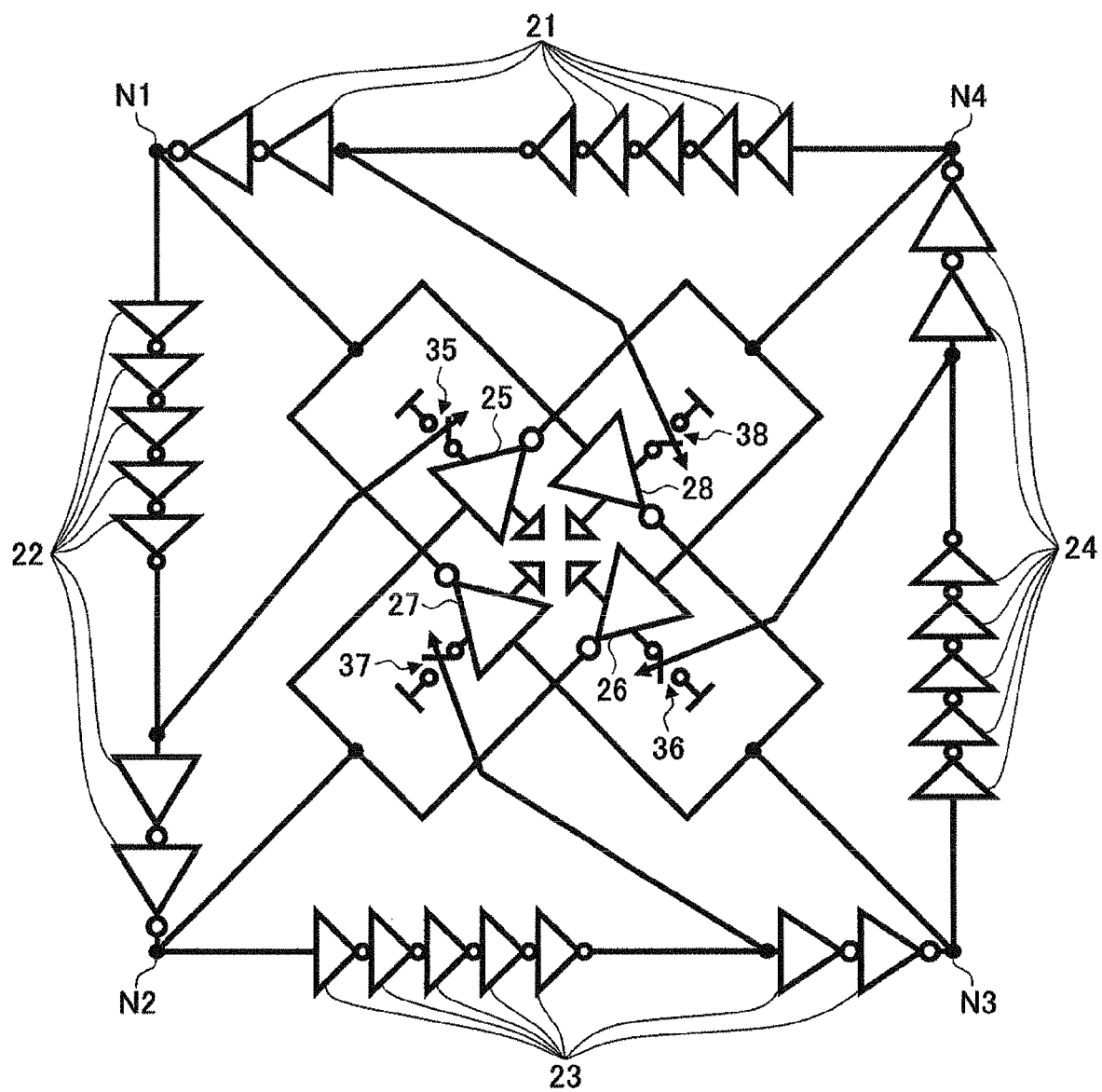
FIG. 13 is a drawing illustrating a variation of the embodiment of the even-number-stage ring oscillator circuit.

FIG. 13 is a drawing illustrating a variation of the embodiment of the even-number-stage ring oscillator circuit. In FIG. 13, the same elements as those of FIG. 4 are referred to by the same numerals, and a description thereof will be omitted.

The ring oscillator circuit illustrated in FIG. 4 includes a plurality of inverters 21, a plurality of inverters 22, a plurality of inverters 23, and a plurality of inverters 24, and the number of inverters of each inverter set is three. On the other hand, the ring oscillator circuit illustrated in FIG. 13 includes a plurality of inverters 21, a plurality of inverters 22, a plurality of inverters 23, and a plurality of inverters 24, and the number of inverters of each inverter set is seven. Other parts of the configuration are the same between FIG. 4 and FIG. 13.

In the configuration illustrated in FIG. 13, the number of inverters between two adjacent nodes of the nodes N1 through N4 is larger compared with the configuration illustrated in FIG. 4. The use of an increased number of inverters reduces a proportion of the latch-function-suspended period in one cycle of the oscillating frequency. Namely, the previously-noted timing displacement at the time of latch reversal becomes relatively small. This allows more stable, accurate oscillating frequency to be obtained.

Figure 14:
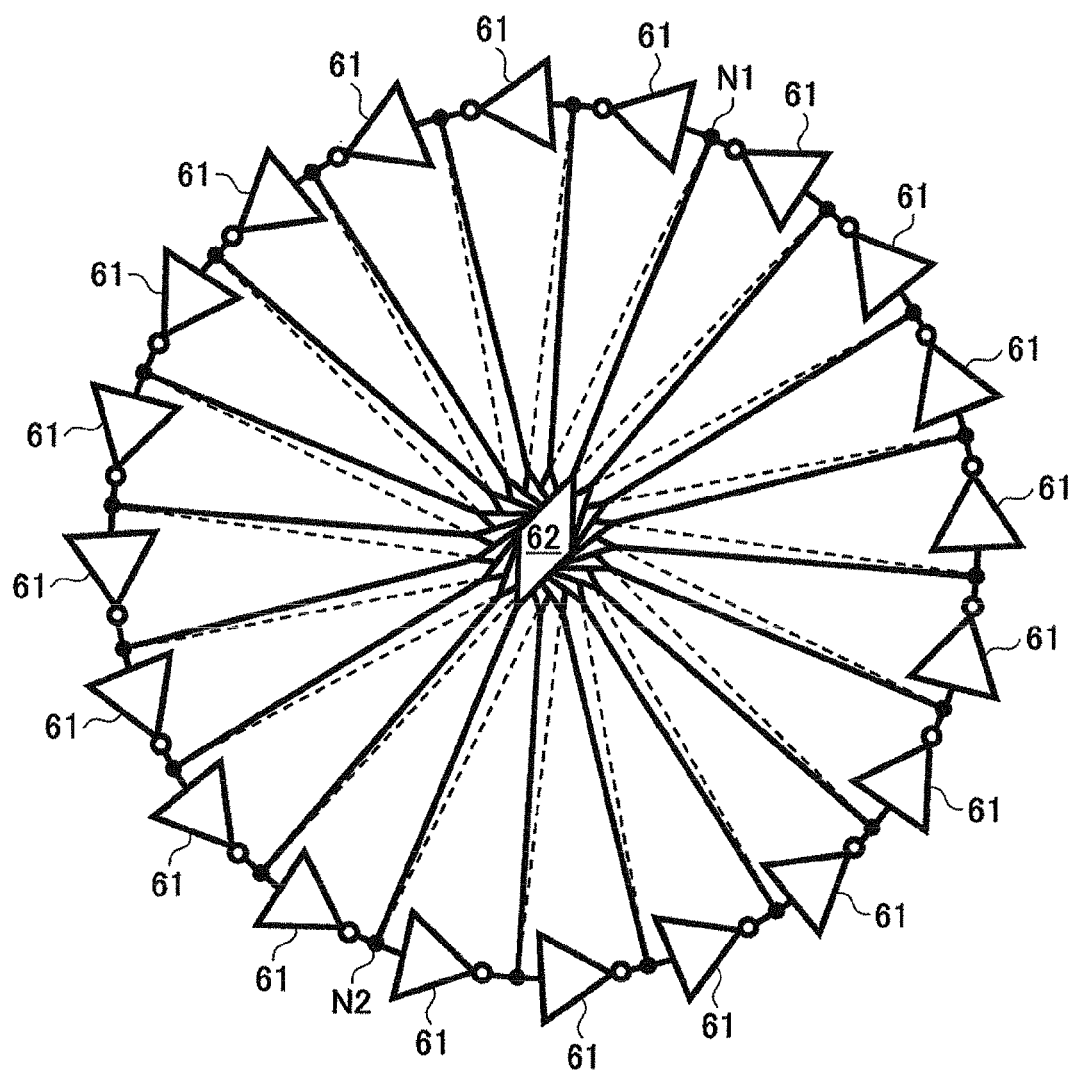
FIG. 14 is a drawing illustrating another variation of the embodiment of the even-number-stage ring oscillator circuit.

FIG. 14 is a drawing illustrating another variation of the embodiment of the even-number-stage ring oscillator circuit. In an even-number-stage ring oscillator circuit, two nodes having a 180-degree phase difference are connected to each other through a latch. The connection points, however, do not have to coincide with 0 degrees, 90 degrees, 180 degrees, and 270 degrees as illustrated in FIG. 4. Further, connection points do not have to be provided only for four phases corresponding to 0 degrees, 90 degrees, 180 degrees, and 270 degrees.

In the ring oscillator circuit illustrated in FIG. 14, a plurality (e.g., an integer multiple of 4) of inverters 61 are connected in series to constitute a ring. When the number of inverters 61 is an integer multiple of 4, each path includes even-number (i.e., an integer multiple of 2) inverters when the ring is divided into two paths, i.e., a first path and a second path.

In the ring, each of latches 62 connects between two nodes that have a 180-degree phase difference. The solid lines in the ring illustrated in FIG. 14 represent latch connections. For example, the node N1 and the node N2 are connected through a latch 62. The latches 62 correspond to the latches and switches illustrated in FIG. 4. Namely, control signals are used to provide and sever a connection between a latch and a power supply. The dotted lines in the ring illustrated in FIG. 14 represent paths through which the control signals are supplied.

As illustrated in FIG. 14, when a latch connection is provided between two nodes having a 180-degree phase difference, such a latch connection may be provided for the output nodes of all the inverters. The provision of such connections can produce a clock signal having extremely stable oscillating frequency. Moreover, instead of connecting latches to the output nodes of all the inverters, latches may be connected to output nodes situated at predetermined intervals such as every second output node or every third output node. The intervals between the output nodes to which the latches are connected do not have to be constant pitches, and the latches may be connected to any given locations.

Figure 15:
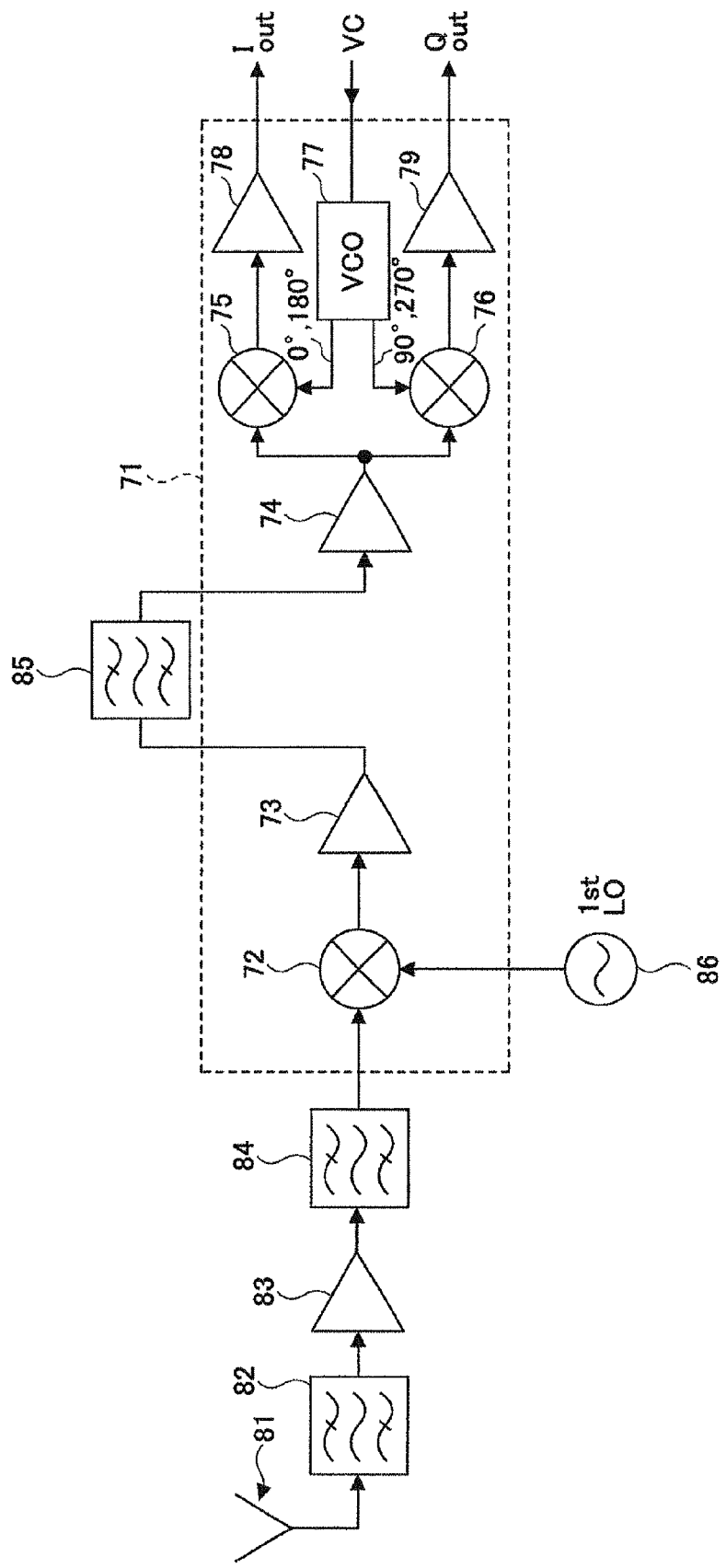
FIG. 15 is a drawing illustrating an example of the configuration of a receiver circuit utilizing the even-number-stage ring oscillator circuit.

FIG. 15 is a drawing illustrating an example of the configuration of a receiver circuit utilizing the even-number-stage ring oscillator circuit of the present embodiment. The receiver circuit of FIG. 15 includes a receiver IC 71, a bandwidth selecting filter 82, a low noise amplifier (LNA) 83, an image eliminating filter 84, a channel selecting filter 85, and a local oscillator 86. The receiver IC 71 includes a mixer circuit 72, am amplifier 73, an amplifier 74, a mixer circuit 75, a mixer circuit 76, a VCO 77, an amplifier 78, and an amplifier 79. The VCO 77 may alternatively be provided outside the receiver IC 71.

A signal received by an antenna 81 is supplied to the receiver IC 71 through the bandwidth selecting filter 82, the low noise amplifier (LNA) 83, and the image eliminating filter 84. The receiver IC 71 generates local signals having 0-degree, 90-degree, 180-degree, and 270-degree phases by use of the VCO 77 that utilizes the ring oscillator circuit of the present embodiment illustrated in FIG. 4, for example. The oscillating frequency of the VCO 77 may be controlled by an analog control voltage VC. The 0-degree local signal and the 180-degree local signal generated by the VCO 77 are supplied to the mixer circuit 75, which downconverts the received signal to extract an in-phase component I. The 90-degree local signal and the 270-degree local signal are supplied to the mixer circuit 76, which downconverts the received signal to extract a quadrature component I.

As described heretofore, a through current that would flow through a latch circuit and an inverter is suppressed by severing a connection between the latch circuit and the power supply in response to a control signal at the time of latch state reversal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An electrical circuit, comprising:
a first path including even-number inverters connected in series from a first node serving as an input side to a second node serving as an output side;
a second path including even-number inverters connected in series from the second node serving as an input side to the first node serving as an output side;
a latch circuit providing a connection between the first node and the second node such that a logical value of the first node and a logical value of the second node are opposite to each other; and
one or more control signal paths to supply one or more control signals to the latch circuit to provide and sever a connection between the latch circuit and a power supply, wherein the one or more control signals include:
a first control signal output from a first inverter that is one of the even-number inverters of the first path, and
a second control signal output from a second inverter that is one of the even-number inverters of the second path.

2. The electrical circuit as claimed in claim 1, wherein the latch circuit includes:
a first latch inverter having an input node connected to the first node and having an output node connected to the second node; and
a second latch inverter having an input node connected to the second node and having an output node connected to the first node.

3. The electrical circuit as claimed in claim 2, wherein the first control signal provides and severs a connection between the second latch inverter and the power supply, and the second control signal provides and severs a connection between the first latch inverter and the power supply.

4. The electrical circuit as claimed in claim 2, wherein the first latch inverter has a drive power that is larger than a drive power of a last-stage inverter of the inverters of the first path, and the second latch inverter has a drive power that is larger than a drive power of a last-stage inverter of the inverters of the second path.

5. The electrical circuit as claimed in claim 1, wherein the first inverter is an odd-numbered inverter other than a first inverter in a sequence of inverters in which the even-number inverters of the first path are counted from the second node, and the second inverter is an odd-numbered inverter other than a first inverter in a sequence of inverters in which the even-number inverters of the second path are counted from the first node.

6. The electrical circuit as claimed in claim 1, further comprising a latch circuit providing a connection between a third node on the first path and a fourth node on the second path such that a logical value of the third node and a logical value of the fourth node are opposite to each other, wherein four-phase clock signals having a $\pi/2$ phase difference with each other are produced at the first through fourth nodes.

7. A ring oscillator circuit, comprising:
a ring including even-number inverters;
a first latch circuit providing a connection between a first node and a second node on the ring; and
one or more control signal paths to supply one or more control signals to the latch circuit to provide and sever a connection between the latch circuit and a power supply,
wherein the ring includes:
a first path including even-number inverters connected in series from the first node serving as an input side to the second node serving as an output side; and
a second path including even-number inverters connected in series from the second node serving as an input side to the first node serving as an output side,
and wherein the one or more control signals include:
a first control signal output from a first inverter that is one of the even-number inverters of the first path; and
a second control signal output from a second inverter that is one of the even-number inverters of the second path.

8. The ring oscillator circuit as claimed in claim 7, wherein the one or more control signals sever a connection between the latch circuit and the power supply prior to timing at which an output logical value of a last-stage inverter of the first path is changed.

9. The ring oscillator circuit as claimed in claim 7, wherein the one or more control signals provide a connection between the first latch circuit and the power supply after a logical value of the first node is changed.

10. The ring oscillator circuit as claimed in claim 7, further comprising a second latch circuit providing a connection between a third node and a fourth node on the ring, wherein four-phase clock signals having a $\pi/2$ phase difference with each other are produced at the first through fourth nodes.

11. A receiver circuit, comprising:
   a ring oscillator circuit including:
      a ring including even-number inverters;
      a first latch circuit providing a connection between a first node and a second node on the ring; and
      a second latch circuit providing a connection between a third node and a fourth node on the ring, wherein the ring oscillator circuit generates four-phase clock signals having a $\pi/2$ phase difference with each other at the first through fourth nodes while one or more control signals responsive to a signal propagating on the ring are used to provide and sever a connection between a power supply and the first and second latch circuits; and
   a mixer circuit configured to downconvert a received signal in response to the four-phase clock signals.

* * * * *